United States Patent
Lorin et al.

(10) Patent No.: US 10,073,144 B2
(45) Date of Patent: Sep. 11, 2018

(54) METHOD OF DETERMINING THE STATE OF CHARGE OF A BATTERY OF AN ELECTRONIC APPLIANCE

(71) Applicant: STMICROELECTRONICS (GRENOBLE 2) SAS, Grenoble (FR)

(72) Inventors: Christophe Lorin, Montbonnot (FR); Jean-Francois Garnier, Vif (FR); Aurélien Mazard, Saint Julien de Ratz (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 588 days.

(21) Appl. No.: 14/494,373

(22) Filed: Sep. 23, 2014

(65) Prior Publication Data

US 2015/0088443 A1    Mar. 26, 2015

(30) Foreign Application Priority Data

Sep. 25, 2013    (FR) ..................... 13 59219

(51) Int. Cl.
  *G01R 31/36*    (2006.01)
(52) U.S. Cl.
  CPC ..... *G01R 31/3624* (2013.01); *G01R 31/3648* (2013.01); *G01R 31/3651* (2013.01)
(58) Field of Classification Search
  CPC ............ G01R 31/3651; G01R 31/3624; G01R 31/3648; Y02T 10/7005; Y02T 10/7044; B60L 11/1861

(Continued)

(56) References Cited

U.S. PATENT DOCUMENTS

| | | | | | |
|---|---|---|---|---|---|
| 5,321,627 | A | * | 6/1994 | Reher | G01R 31/3624 320/DIG. 21 |
| 5,589,757 | A | * | 12/1996 | Klang | H01M 10/44 320/160 |

(Continued)

FOREIGN PATENT DOCUMENTS

| | | |
|---|---|---|
| DE | 10 2010 003 422 A1 | 10/2011 |
| FR | 2973517 A1 | 10/2012 |
| JP | 2005-37230 A | 2/2005 |

OTHER PUBLICATIONS

Plett, "Extended Kalman filtering for battery management systems of LiPB-based HEV battery packs Part 1. Background," *Journal of Power Sources* 134:252-261, 2004.

(Continued)

*Primary Examiner* — Roy Y Yi
*Assistant Examiner* — Jeffrey Aiello
(74) *Attorney, Agent, or Firm* — Seed IP Law Group LLP

(57) ABSTRACT

A state of charge of a battery is estimated in several iterations, each iteration including: acquiring a measurement of intensity of current supplied by the battery, acquiring a measurement of voltage supplied by the battery, estimating a first state of charge of the battery based on a first estimated state of charge obtained upon a previous iteration and on the current intensity measurement, estimating a value of intensity of current supplied by the battery based on the voltage measurement and on a state of charge of the battery obtained upon the previous iteration, and calculating a corrected state of charge by adding to the first estimated state of charge a corrective term obtained by the product of a first correction gain multiplied by a factor representative of a difference between the estimated and measured current intensities.

32 Claims, 2 Drawing Sheets

(58) Field of Classification Search
USPC ............... 320/107, 132, 162; 324/426, 430; 702/63
See application file for complete search history.

(56) References Cited

U.S. PATENT DOCUMENTS

| | | | |
|---|---|---|---|
| 8,103,485 B2 | 1/2012 | Plett | |
| 2001/0035739 A1* | 11/2001 | Laig-Horstebrock | G01R 31/3662 320/132 |
| 2003/0016023 A1* | 1/2003 | Richter | G01F 1/06 324/427 |
| 2005/0231206 A1* | 10/2005 | Denning | G01R 31/3648 324/430 |
| 2008/0094035 A1* | 4/2008 | Plett | G01R 31/361 320/136 |
| 2009/0316580 A1* | 12/2009 | Pang | G06F 15/7842 370/235 |
| 2012/0041698 A1 | 2/2012 | Zhang et al. | |
| 2013/0002199 A1* | 1/2013 | Hu | H02J 7/0004 320/112 |
| 2013/0223565 A1* | 8/2013 | McCallister | H04L 25/03343 375/297 |
| 2014/0244225 A1* | 8/2014 | Balasingam | G06F 17/5036 703/2 |
| 2014/0257726 A1* | 9/2014 | Baba | G01R 31/3624 702/63 |
| 2015/0142349 A1* | 5/2015 | Fernandez | G01R 31/3651 702/61 |

OTHER PUBLICATIONS

Plett, "Extended Kalman filtering for battery management systems of LiPB-based HEV battery packs Part 2. Modeling and identification," *Journal of Power Sources 134*:262-276, 2004.

Plett, "Extended Kalman filtering for battery management systems of LiPB-based HEV battery packs Part 3. State and parameter estimation," *Journal of Power Sources 134*:277-292, 2004.

\* cited by examiner

METHOD OF DETERMINING THE STATE OF CHARGE OF A BATTERY OF AN ELECTRONIC APPLIANCE

BACKGROUND

Technical Field

The present disclosure relates to batteries of portable electronic appliances, such as the batteries of laptops, digital tablets and mobile telephones such as smartphones.

Description of the Related Art

Currently, a major drawback of appliances such as mobile telephones and digital tablets lies in their short battery time. Furthermore, as it is possible to install many very diverse applications with varying degrees of complexity in these appliances, it is difficult for manufacturers to anticipate any pattern of use of them and thus to estimate the extent to which the battery will be used.

Some energy gauging devices do exist and are installed in these appliances to provide an estimation of the state of charge of the battery, for example in percentage compared to minimum and maximum charges. However, such devices do not generally take into account any drifts gradually occurring in operating parameters of a battery over the charge and discharge cycles. The result is that the estimated state of charge provided by these devices becomes less and less representative of an actual state of charge over time.

Generally, the energy gauging devices use information such as the current and the voltage of the battery to estimate the state of charge of the battery. The simplest of such devices are based on an open-circuit measurement of the voltage, e.g., when the battery is not connected to any charge and is not supplying any current. The open-circuit voltage measurement gives a good indication of the state of charge of a battery. However, when this measurement is taken while the battery is supplying current or has just supplied current, the state of charge estimated on the basis of such a measurement can contain a significant error. This error is due to variations in the internal impedance and physico-chemical time constants of the battery.

Certain energy gauging devices implement a Coulomb counter which measures the current and integrates it over time to give a measurement of the charge respectively supplied or received by the battery during a discharge or a charge. Such a measurement obtains excellent linearity, and therefore obtains good short-term accuracy. However, this use requires an initial value to be determined, as the Coulomb counter merely supplies charge variation information rather than an absolute value of charge quantity supplied. Coulomb counters also undergo current measurement drifts that build up over time.

Certain energy gauging devices use modeling of the electrical behavior of the battery. The simplest and most frequently used model consists of an open-circuit voltage source based on a state of charge, and of a constant series impedance. This model, which differs from one type of battery to another, can be obtained from a characterization of the battery. The devices based on such a model enable the current to be predicted and the state of charge of the battery to be estimated from a battery voltage measurement with better robustness and accuracy than devices based solely on a voltage measurement. In particular, these devices obtain good long-term accuracy while avoiding drifts. However, these devices are quite ineffective to monitor the short-term changes in the state of charge of the battery, due to insufficient accuracy in the definition of the model parameters such as the internal impedance of the battery, and due to the use of open-circuit voltage measurements. While the variations in the internal capacity of a battery can be easily assessed and taken into account, the same is not true of the variations in the internal resistance of the battery. Now, an incorrect assessment of the variations in the internal resistance can generate an instability that could cause jumps and oscillations in the estimation of the state of charge of a battery.

Certain devices combine a current integration through a Coulomb counter and a voltage measurement with or without a model to correct the state of charge estimation obtained from the current measurement. However, the corrections are made by discrete steps, which generates jumps or oscillations in the estimation of the state of charge. As such jumps or oscillations are not acceptable for the user, the value of the state of charge is filtered. Now, such filtering inevitably generates a delay in the variations in the state-of-charge value and thus affects the accuracy of this value. In addition, the adjustment of the filter parameters, particularly based on the battery impedance, proves tricky due to the multiple types of battery and types of appliances powered by a battery, and due to the difficulty estimating the internal resistance of the battery.

To take the drifts of the operating parameters into account throughout the lifetime of a battery, complex algorithms have been developed, in particular combining different methods to overcome the limitations of each method. Therefore, energy gauging devices have recently been developed which comprise a Coulomb counter and a voltage measurement and take the internal resistance and the capacity of the battery into account.

Another example of a complex algorithm is given in U.S. Pat. No. 8,103,485 which describes an energy gauging device implementing a double extended Kalman filter and a simultaneous acquisition of the current and the voltage of the battery. This device offers the main advantage of continuously correcting the estimation of the state of charge of a battery based on a complex model of the battery.

However, energy gauging devices implementing complex algorithms require significant calculation resources, and several analog-digital converters to simultaneously measure the voltage, the current and possibly the temperature of the battery. These devices also require complex management of software configurations to take all the combinations of appliances and types of battery currently marketed into account. Some of these devices must also manage calibration steps.

Energy gauging devices implementing complex algorithms thus prove to be rather ill adapted to implementation in appliances such as smartphones and tablets, for reasons of cost and limited battery life.

BRIEF SUMMARY

Some embodiments relate to a method for estimating a state of charge of a battery comprising several iterations, each iteration comprising steps of: acquiring a measurement of intensity of current supplied by the battery, acquiring a measurement of voltage supplied by the battery, estimating a first state of charge of the battery based on a first estimated state of charge obtained upon a previous iteration and on the current intensity measurement, estimating a value of intensity of current supplied by the battery based on the voltage measurement and on a state of charge of the battery obtained upon the previous iteration, and calculating a corrected state of charge by adding to the first estimated state of charge a corrective term obtained by the product of a first correction gain multiplied by a factor representative of a difference between the estimated and measured current intensities.

According to one embodiment, the method comprises a step of estimating a second state of charge of the battery based on a second estimated state of charge obtained upon the previous iteration and on the estimated current intensity value, the factor being obtained by calculating a difference between the first and second estimated states of charge.

According to one embodiment, the first and second estimated states of charge are values integrated over a first period, and the factor is obtained by deriving over the first period the difference between the first and second estimated states of charge.

According to one embodiment, the voltage measurements are acquired in a second period, and the current intensity measurements are acquired in a third period, the first period being greater than or equal to the second period and the second period being greater than or equal to the third period.

According to one embodiment, the first period is a multiple of the second period and of the third period.

According to one embodiment, each estimated current intensity value is obtained using the following equation:

$$\hat{I}_k = \frac{V_k - OCV(SC_{k-1})}{R}$$

in which:

$\hat{I}_k$ is the estimated current intensity value, $V_k$ is the voltage measurement obtained upon the present iteration, OCV( ) is a model of the voltage supplied by the battery according to the state of charge of the battery, $SC_{k-1}$ is a corrected state of charge obtained upon a previous iteration, and R is the internal resistance of the battery.

According to one embodiment, the method comprises a step of determining a corrected capacity value of the battery by adding to a corrected capacity value obtained upon the previous iteration a corrective term obtained by the product of a second correction gain multiplied by a difference between the corrected state of charge and the first estimated state of charge obtained upon the previous iteration, the estimation of the first state of charge being made by taking into account the corrected capacity value obtained upon the previous iteration.

According to one embodiment, the method comprises a step of determining a corrected internal impedance value of the battery by adding to an internal impedance value obtained upon the previous iteration a corrective term obtained by the product of a third correction gain multiplied by the factor, the estimation of the current intensity value being made by taking into account the corrected internal impedance value obtained upon the previous iteration.

According to one embodiment, each correction gain is determined only if the factor by which it is multiplied has a value greater than a threshold below which the corresponding corrective term does not have a significant value.

According to one embodiment, each correction gain is determined using one of the algorithms belonging to the group comprising LMS, RLS, NLMS, and extended Kalman filter.

Some embodiments also relate to a device for estimating a state of charge of a battery, comprising a voltage measuring circuit and a current intensity measuring circuit associated with the battery, and an analog-digital converter providing samples of current intensity measurement and of voltage measurement based on the measurements provided by the current and voltage measuring circuits. According to one embodiment, the device is configured to implement embodiments of the methods described above.

According to one embodiment, the battery comprises several parallel-connected branches of series-connected cells, the device comprising one voltage measuring circuit per cell of the battery, one current measuring circuit per parallel branch of series-connected cells of the battery, one current intensity estimating circuit per cell of the battery, one circuit for estimating a first state of charge per parallel branch of the battery, and one circuit for calculating a corrected state of charge per cell of the battery.

In an embodiment, a method, comprises: iteratively estimating a state of charge of a battery, at least one iteration of the estimating including: receiving an indication of an intensity of current supplied by the battery; receiving an indication of a voltage supplied by the battery; estimating a first state of charge of the battery during the iteration based on an estimated first state of charge of a previous iteration and on the received indication of the intensity of current supplied by the battery; estimating an intensity of current supplied by the battery based on the received indication of the voltage supplied by the battery and on a corrected state of charge of the battery of the previous iteration, and calculating a corrected state of charge of the iteration by adding to the estimated first state of charge of the iteration a corrective term, the corrective term being based on a product of a first correction gain and a factor representative of a difference between the estimated intensity of current and the received indication of the intensity of current supplied by the battery. In an embodiment, the iteration comprises estimating a second state of charge of the battery during the iteration based on a second estimated state of charge of the previous iteration and on the estimated intensity of current and the factor is determined based on a difference between the first and second estimated states of charge. In an embodiment, the first and second estimated states of charge are values integrated over a first period, and the factor is determined by deriving over the first period the difference between the first and second estimated states of charge. In an embodiment, the indication of the voltage is based on a measurement acquired in a second period, and the indication of the current intensity is based on a measurement acquired in a third period, the first period being greater than or equal to the second period and the second period being greater than or equal to the third period. In an embodiment, the first period is a multiple of the second period and of the third period. In an embodiment, the estimated intensity of current is based on the following equation:

$$\hat{I}_k = \frac{V_k - OCV(SC_{k-1})}{R}$$

in which:

$\hat{I}_k$ is the estimated intensity of current, $V_k$ is the indication of a voltage of the present iteration, OCV( ) is a model of voltage supplied by the battery according to the state of charge of the battery, $SC_{k-1}$ is the corrected state of charge of the previous iteration, and R represents an internal resistance of the battery. In an embodiment, the iteration comprises determining a corrected capacity value of the battery by adding to a corrected capacity value of the previous iteration a second corrective term, the second corrective term being based on a product of a second correction gain and a difference between the corrected state of charge of the iteration and the estimated first state of charge of the previous iteration, the estimated first state of charge being based on a corrected capacity value of the previous iteration. In an embodiment, the iteration comprises determining a corrected internal impedance value of the battery by adding to an internal impedance value of the previous iteration a corrective impedance term, the corrective impedance term being based on a product of an impedance correction gain and the factor, the estimated current intensity being based on a corrected internal impedance value of the previous iteration. In an embodiment, the method comprises determining, for a given iteration, whether to calculate a corrected state of charge based on whether the factor has a value greater than a threshold value. In an embodiment, the method comprises determining the correction gain using at least one of the algorithms belonging to the group comprising LMS, RLS, NLMS, and extended Kalman filter.

In an embodiment, a device comprises: a memory; and processing circuitry, which, in operation, iteratively estimates a state of charge of a battery, at least one iteration of the estimating including: receiving an indication of an intensity of current; receiving an indication of a voltage; estimating a first state of charge during the iteration based on an estimated first state of charge of a previous iteration and on the received indication of the intensity of current; estimating an intensity of current based on the received indication of the voltage and on a corrected state of charge of the previous iteration, and calculating a corrected state of charge of the iteration by adding to the estimated first state of charge of the iteration a corrective term, the corrective term being based on a product of a first correction gain and a factor representative of a difference between the estimated intensity of current and the received indication of the intensity of current. In an embodiment, at least one iteration comprises estimating a second state of charge during the iteration based on a second estimated state of charge of the previous iteration and on the estimated intensity of current and the factor is determined based on a difference between the first and second estimated states of charge. In an embodiment, the processing circuitry comprises one or more integrators, the first and second estimated states of charge are values integrated by the one or more integrators over a first period, and the factor is determined by deriving over the first period the difference between the first and second estimated states of charge. In an embodiment, the indication of the voltage is based on a measurement acquired in a second period, and the indication of the current intensity is based on a measurement acquired in a third period, the first period being greater than or equal to the second period and the second period being greater than or equal to the third period. In an embodiment, the first period is a multiple of the second period and of the third period. In an embodiment, the estimated intensity of current is based on the following equation:

$$\hat{I}_k = \frac{V_k - OCV(SC_{k-1})}{R}$$

in which:
$\hat{I}_k$ is the estimated intensity of current,
$V_k$ is the indication of a voltage of the present iteration,
OCV( ) is a model of voltage supplied by the battery according to the state of charge of the battery, $SC_{k-1}$ is the corrected state of charge of the previous iteration, and R represents an internal resistance of the battery. In an embodiment, the processing circuitry comprises an adder and the iteration includes determining a corrected capacity value by adding to a corrected capacity value of the previous iteration a second corrective term, the second corrective term being based on a product of a second correction gain and a difference between the corrected state of charge of the iteration and the estimated first state of charge of the previous iteration, the estimated first state of charge being based on a corrected capacity value of the previous iteration. In an embodiment, the processing circuitry comprises an adder and the iteration includes determining a corrected internal impedance value by adding to an internal impedance value of the previous iteration a corrective impedance term, the corrective impedance term being based on a product of an impedance correction gain and the factor, the estimated current intensity being based on a corrected internal impedance value of the previous iteration. In an embodiment, the processing circuitry determines whether to calculate a corrected state of charge for a given iteration based on whether the factor has a value greater than a threshold value. In an embodiment, the device comprises: a voltage measuring circuit; a current intensity measuring circuit; and an analog-digital converter coupled to the processing circuitry and which, in operation, provides samples of current intensity measurements and of voltage measurements based on measurements provided by the current and voltage measuring circuits to the processing circuitry. In an embodiment, the device comprises a multiplexer coupled to the voltage measuring circuit, the current intensity measuring circuit and the analog-digital converter. In an embodiment, the device comprising: one voltage measuring circuit per cell of the battery; one current measuring circuit per parallel branch of series-connected cells of the battery; one current intensity estimating circuit per cell of the battery; one circuit to estimate a first state of charge per parallel branch of the battery; and one circuit to calculate a corrected state of charge per cell of the battery. In an embodiment, the processing circuitry comprises: at least one integrator; current intensity prediction circuitry; drift calculation circuitry; state of charge calculation circuity; and at least one adder.

In an embodiment, a non-transitory computer-readable memory medium's contents cause one or more processing devices to, in operation, iteratively estimate a state of charge of a battery, at least one iteration of the estimating including: receiving an indication of an intensity of current; receiving an indication of a voltage; estimating a first state of charge during the iteration based on an estimated first state of charge of a previous iteration and on the received indication of the intensity of current; estimating an intensity of current based on the received indication of the voltage and on a corrected state of charge of the previous iteration, and calculating a corrected state of charge of the iteration by adding to the estimated first state of charge of the iteration a corrective term, the corrective term being based on a product of a first correction gain and a factor representative of a difference between the estimated intensity of current and the received indication of the intensity of current. In an embodiment, the iteration comprises estimating a second state of charge of the battery during the iteration based on a second estimated state of charge of the previous iteration and on the estimated intensity of current and the factor is determined based on a difference between the first and second estimated states of charge. In an embodiment, the first and second estimated states of charge are values integrated over a first period, and the factor is determined by deriving over the first period the difference between the first and second estimated states of charge. In an embodiment, the contents cause the processing circuitry, in operation, to determine whether to calculate a corrected state of charge for a given iteration based on whether the factor has a value greater than a threshold value.

BRIEF DESCRIPTION OF THE SEVERAL VIEWS OF THE DRAWINGS

Some examples of embodiments will be described below in relation with, but not limited to, the following figures, in which.

DETAILED DESCRIPTION

Figure 1:
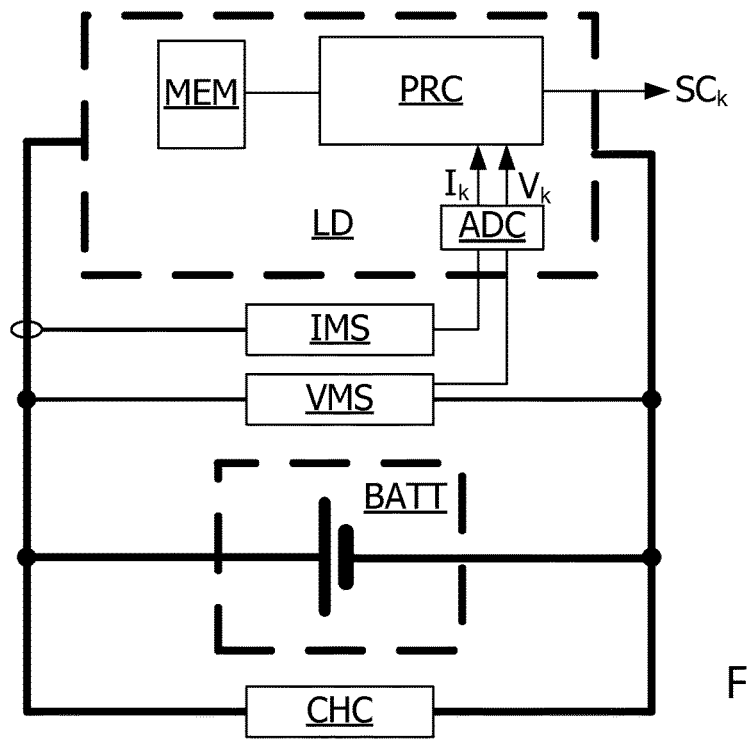
FIG. 1 schematically represents a battery associated with a charge circuit and a battery state-of-charge circuit, according to one embodiment, FIG. 2 schematically represents a battery associated with a charge circuit and a battery state-of-charge circuit, according to another embodiment, FIGS. 3 to 5 schematically represent processing functions for processing the state of charge of the battery, according to various embodiments.

FIG. 1 represents a battery or a battery BATT cell connected in parallel to a charge circuit CHC and to a voltage measuring circuit VMS. One of the terminals of the battery BATT is connected to a current measuring circuit IMS. The circuit CHC is configured to be linked to a power source and to charge the battery BATT. The circuits VMS and IMS are configured to provide a state-of-charge circuit LD with measurements of voltage and of intensity of current. The circuit LD may comprise analog-digital converters ADC to convert the measurements provided by the circuits VMS, IMS into digital voltage $V_k$ and current intensity $I_k$ values. The circuit LD comprises a processing circuit PRC which can be connected to a memory MEM and which receives the voltage $V_k$ and current intensity $I_k$ values at output of the converters ADC. The circuit PRC is configured to provide a battery BATT state-of-charge value $SC_k$ based on the measured values $V_k$, $I_k$. The circuit LD can be powered by the battery BATT. The battery BATT can indifferently consist of only one cell or of several electrochemical cells.

Figure 2:
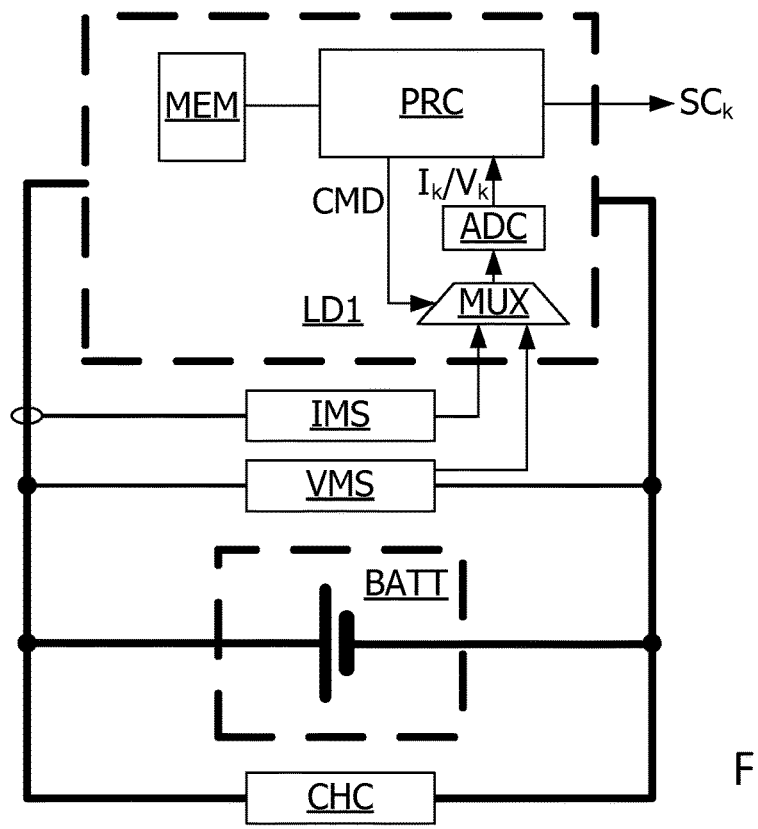

FIG. 2 represents the battery or the battery cell BATT and the circuits CHC, VMS, IMS, the circuits VMS and IMS being connected to a state-of-charge circuit LD1. The circuit LD1 differs from the circuit LD in that it comprises only one analog-digital converter ADC connected at output to an input of the circuit PRC. The circuit ADC is linked to the circuits VMS and IMS through a multiplexer MX providing at input of the converter ADC either a voltage measurement $V_k$, or a current intensity measurement $I_k$, for example based on commands CMD sent by the circuit PRC.

The internal behavior of the battery BATT can be modeled using the following equations:

$$SC_k = SC_{k-1} + I_k \frac{dt}{C} \quad (1)$$

$$V_k = OCV(SC_k) + R \cdot I_k \quad (2)$$

in which:

$SC_k$ and $SC_{k-1}$ represent the values of two states of charge of the battery BATT estimated at instants k and k−1, dt represents the time interval between the instants k−1 and k, $I_k$ represents the value of a sample of a measurement of the intensity of current supplied by the battery during the time interval dt, C represents the rated capacity of the battery, in ampere-hour, $V_k$ represents the value of a sample of a measurement of the voltage supplied by the battery, measured at the instant k, OCV(SC) represents a model of the battery supplying the terminals of the battery with the voltage based on the state of charge SC (estimated or corrected) of the battery, and R represents the internal impedance of the battery.

The equation (1) classically models the behavior of a Coulomb counter. The model OCV of the battery can be more or less complex, so as to possibly take the electrochemical behavior of the battery, and in particular relaxation and hysteresis phenomena, into account. For greater clarity, the equations (1) and (2) are chosen for their simplicity. It will be understood that other more complex known equations, modeling the behavior of a battery in greater detail, can be implemented.

According to one embodiment, the circuit PRC functions in an adaptive manner, by iteration, by estimating a first state of charge of the battery based on a first estimated state of charge obtained upon the previous iteration, and on measurements of intensity of current supplied by the battery, by estimating values of intensity of current supplied by the battery based on measurements of the voltage of the battery and on a state of charge of the battery obtained upon a previous iteration, and by calculating a corrected state of charge by adding to the first estimated state of charge a corrective term obtained by the product of a correction gain multiplied by a factor representative of a difference between the estimated and measured intensities of current. A corrected state of charge is provided as a result, for example to be displayed in the form of a percentage between a zero state of charge and a maximum state of charge. The correction gain can be obtained by an adaptive filter such as LMS (Least-Mean Squares), RLS (Recursive Least Squares), NLMS (Normalized Least-Mean Squares), or more complex filters such as the extended Kalman filter. Even by implementing an extended Kalman filter, this determination method facilitates using fewer calculations than existing algorithms, in particular those also implementing such a filter. This method can be implemented to continuously update the state of charge of a battery, in particular without having to wait for events such as exceeding threshold values.

Figure 3:
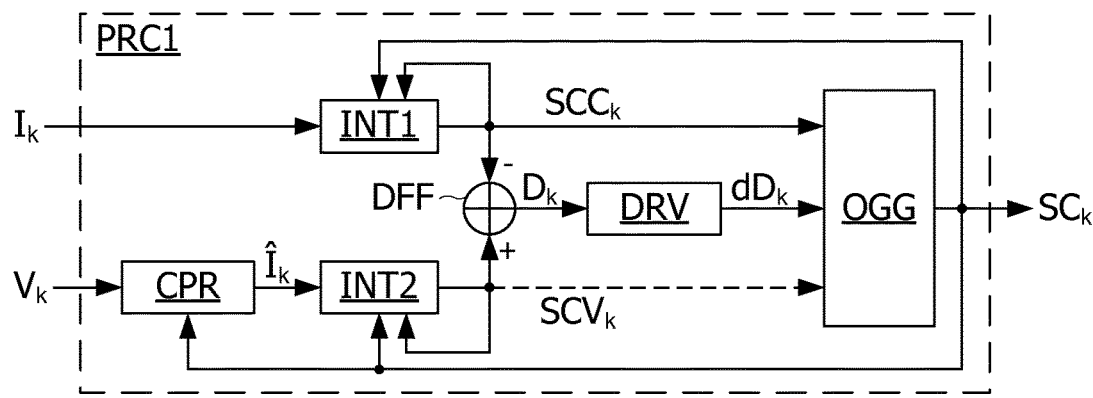

FIG. 3 represents processing functions implemented in a processor PRC1 corresponding to the processor PRC, according to one embodiment. The processor PRC1 implements a current intensity prediction function CPR, current integration functions INT1, INT2, a difference calculation function DFF, a drift function DRV and a function for calculating a state of charge OGG. At each instant k, the function CPR receives voltage measurement $V_k$ samples and a corrected state of charge $SC_{k-1}$ provided by the function OGG for a previous instant k−1, and determines an estimated value $\hat{I}_k$ of the intensity of the current supplied by the battery BATT between the instants k−1 and k. The function CPR can apply the following equation:

$$\hat{I}_k = \frac{V_k - OCV(SC_{k-1})}{R} \quad (3)$$

it being possible to deduce this equation from the equation (2).

The function INT1 applies the equation (1) to each current intensity measurement $I_k$ sample to obtain an instantaneous state-of-charge value. Then, the function INT1 integrates over a certain period t3 the instantaneous values obtained to provide at each instant k a state-of-charge value $SCC_k$. Therefore, the value $SCC_k$ can be obtained thanks to the following equation:

$$SCC_k = SCC_{k-1} + I_k \frac{t1}{C}, \quad (4)$$

integrated over the period t3 in which $SCC_{k-1}$ represents the state-of-charge value provided by the function INT1 at the instant k−1, and t1 is the period of providing the measurement $I_k$ samples. The function INT2 applies the equation (1) to each estimated current intensity value $\hat{I}_k$ to obtain an instantaneous state-of-charge value. Then, over the period t3 the function INT2 integrates the instantaneous values obtained to provide at each instant k a state-of-charge value $SCV_k$. Therefore, the value $SCV_k$ can be obtained thanks to the following equation:

$$SCV_k = SCV_{k-1} + \hat{I}_k \frac{t2}{C}, \quad (5)$$

integrated over the period t3 in which $SCV_{k-1}$ represents the state-of-charge value provided by the function INT2 at the instant k−1, and t2 is the period of providing the measurement $V_k$ samples. The functions INT1 and INT2 can be set to the last value of the corrected state of charge $SC_k$ provided by the processor PRC1.

The values $SCC_k$ and $SCV_k$ are provided at input of the function DFF. The value $SCC_k$, and optionally the value $SCV_k$, are provided at input of the function OGG. At each instant k, the function DFF provides the function DRV with a difference $D_k = SCV_k - SCC_k$ between the values $SCV_k$ and $SCC_k$. At each instant k, the function DRV provides the function OGG with a variation $dD_k$ in the difference $D_k$, obtained by dividing the difference $D_k$ by the duration of a period t3. At each instant k, the function OGG provides a value of corrected state of charge $SC_k$ of the battery BATT based on the values $SCC_k$ and $dD_k$ received from the functions INT1 and DRV. For this purpose, the values $SC_k$ can be obtained using the following equation:

$$SC_k = SCC_k + L_k^{SC} \cdot dD_k \quad (6)$$

in which $L_k^{SC}$ represents a corrective gain which can be calculated using different algorithms such as LMS, RLS, NLMS, or extended Kalman filter. The values $SC_k$ are sent to the functions CPR, INT1 and INT2, as well as at output of the processor PRC1 for example to be stored and/or displayed.

For example by applying the RLS algorithm, the corrective gain $L_k^{SC}$ can be calculated using the following equation:

$$L_k^{SC} = \frac{P_{k-1}^{SC} \cdot F(SCC_k)}{1 + P_{k-1}^{SC} \cdot F(SCC_k)^2} \quad (7)$$

in which $F(SCC_k)$ is a coefficient relating to the state of charge $SCC_k$, and the term $P_{k-1}^{SC}$ was calculated upon the previous iteration, using the following equation:

$$P_{k-1}^{SC}(1 - L_{k-1}^{SC} \cdot F(SC_{k-1})) \cdot P_{k-2}^{SC} \quad (8)$$

The coefficient $F(SC_k)$ can be adjusted to obtain a fast and stable correction, by a function or a table. As a simplified example, the coefficient $F(SC_k)$ can be defined based on the state of charge $SC_k$ in accordance with the following table:

TABLE 1

| $SC_k$ | $F(SC_k)$ |
|---|---|
| [0%, 10%[ | 2 |
| [10%, 20%[ | 1 |
| [20%, 80%[ | 0.5 |
| [80%, 100%] | 1 |

It shall be noted that the calculations to be performed in accordance with the equations (7) and (8) may not be performed if the difference $dD_k$ is insufficient, e.g., if this difference triggers an insignificant correction of the state of charge $SCC_k$. Therefore, the corrected state of charge $SC_k$ may remain unchanged for several iterations while the difference $dD_k$ remains below a certain threshold below which the corrective term $L_k^{SC} dD_k$ is treated as not significant.

The period t1 may have a duration that is shorter than or equal to the period t2, and the period t2 may have a duration that is shorter than or equal to the period t3. In an embodiment, the period t3 is a multiple of the period t1 and a multiple of the period t2. However, with the calculation mode of the state of charge $SC_k$, other values for the period t3 are possible, with a possible slight deterioration in the accuracy of the results.

At the end of each period t3, the functions INT1 and INT2 can be reset with the value $SC_k$. Therefore, as the integration functions INT1, INT2 are executed from a same initial value $SC_k$, the difference provided by the function DFF does correspond to the difference between the integration of the estimated $\hat{I}_k$ and measured $I_k$ intensities of current. It shall also be noted that the function OGG optionally may not use the values $SCV_k$. In practice, the function OGG can use the last value $SCV_k$ received as initial value in the absence of any measurement of current and of voltage, or when the current measured $I_k$ is very low (case where the battery is used very little or not at all).

Therefore, it is possible to implement different sampling periods t1, t2 for the acquisition of the current intensity measurements and the voltage measurements, which makes uncorrelated measurements of voltage and current possible. The same converter ADC can thus be used to produce the current and voltage measurement samples, as shown in FIG. 2.

The calculation of the corrective term $L_k^{SC} dD_k$ is not linked to the time, and in particular to the period t1 of acquisition of the current measurement $I_k$ samples. The corrective term can thus be based on an absolute drift between the state-of-charge values $SCC_k$ and $SCV_k$, which facilitates the correction of the state of charge $SC_k$ to be delayed, for example during periods in which the state of charge of the battery is not required. It shall also be noted that the derivative depends on the difference between the estimated $\hat{I}_k$ and measured $I_k$ values of the intensity of current because, if these values are equal, the states of charge $SCV_k$ and $SCC_k$ are equal, and thus the derivative $dD_k$ is zero.

Figure 4:
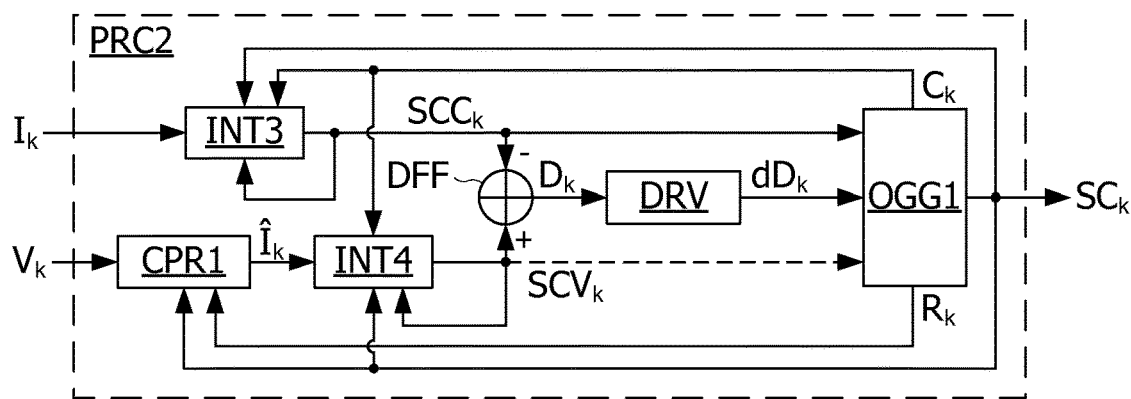

FIG. 4 represents processing functions implemented in a processor PRC2 corresponding to the processor PRC, according to another embodiment. The processor PRC2 differs from the processor PRC1 in that, at each instant k, a function OGG1 determines the state-of-charge value $SC_k$ of the battery BATT based on the values received from the integration functions INT3, INT4 and from the function DRV. The function OGG1 also determines at each instant k corrected values of capacity $C_k$ and of internal impedance $R_k$ of the battery BATT. The processor PRC2 further differs from the processor PRC1 in that the values $C_k$ and $R_k$ are sent by the function OGG1 to a prediction function CPR1 and to the integration function INT4. The function CPR1 determines, using the equation (2), the estimated value $\hat{I}_k$ of the intensity of current supplied by the battery BATT between the instants k−1 and k based on the measurement $V_k$ sample, and on the values $SC_{k-1}$ and $R_{k-1}$ provided upon the previous iteration k−1. The function CPR1 can thus apply the following equation:

$$\hat{I}_k = \frac{V_k - OCV(SC_{k-1})}{R_{K-1}} \quad (9)$$

The function INT4 implements the equation (1) to provide at each instant k a state-of-charge value $SCV_k$ integrated over the period t3 based on the estimated current intensity values $\hat{I}_k$, and on the values $SCV_{k-1}$ and $C_{k-1}$ provided upon the previous iteration. The function INT4 can thus apply the following equation:

$$SCV_k = SCV_{k-1} + \hat{I}_k \cdot \frac{t2}{C_{k-1}} \quad (10)$$

in which $C_{k-1}$ represents the corrected capacity of the battery determined upon the previous iteration.

The processor PRC2 further differs from the processor PRC1 in that the values $C_k$ are sent by the function OGG1 to the integration function INT3. The function INT3 implements the equation (1) to provide at each instant k a state-of-charge value $SCC_k$ based on the values $SCC_{k-1}$ and $C_{k-1}$, and on the current intensity measurements. The function INT3 can apply the following equation:

$$SCC_k = SCC_{k-1} + I_k \cdot \frac{t1}{C_{k-1}} \quad (11)$$

The function OGG1 can apply the equations (6) to (8) to determine the corrected state of charge $SC_k$ of the battery for the instant k. To determine the corrected capacity $C_k$ of the battery BATT in ampere-hour, the function OGG1 can apply the following equation:

$$C_k = C_{k-1} + L_k^C \cdot (SC_k - SCC_{k-1}) \quad (12)$$

in which $L_k^C$ represents a corrective gain which can be calculated using different algorithms such as LMS, RLS, NLMS, or extended Kalman filter. In the example of the RLS algorithm, the corrective gain $L_k^C$ can be obtained using the following equations:

$$L_k^C = \frac{P_{k-1}^C \cdot E(L_k^{SC}, I_k)}{1 + P_{k-1}^C \cdot E(L_k^{SC}, I_k)^2} \quad (13)$$

and $$P_{k-1}^C = (1 - L_{k-1}^C \cdot E(L_{k-1}^{SC}, I_{k-1})) \cdot P_{k-2}^C \quad (14)$$

in which $E(L_k^{SC}, I_k)$ is a coefficient which depends on the corrective gain $L_k^{SC}$ and on the current intensity measurement $I_k$. The coefficient $E(L_k^{SC}, I_k)$ can be defined by a function or a table. For example, the coefficient $E(L_k^{SC}, I_k)$ can be chosen equal to $-aI_k$, a being a small positive number.

It shall be noted that the calculations to be performed in accordance with the equations (13) and (14) may not be performed if the difference $(SC_k - SCC_{k-1})$ is insufficient, e.g., if this difference triggers an insignificant correction of the corrected capacity $C_k$. Therefore, the corrected capacity $C_k$ may remain unchanged for several iterations while the difference $(SC_k - SCC_{k-1})$ remains below a certain threshold below which the corrective term $L_k^C(SC_k - SCC_{k-1})$ is treated as not significant.

To determine the corrected internal resistance $R_k$ of the battery BATT at each instant k, the function OGG1 can apply the following equation:

$$R_k = R_{k-1} + L_k^R \cdot dD_k \quad (15)$$

in which $R_{k-1}$ represents the corrected internal resistance of the battery determined upon the previous iteration, and $L_k^R$ represents a corrective gain which can be calculated using different algorithms such as LMS, RLS, NLMS, or an extended Kalman filter. In the example of the RLS algorithm, the corrective gain $L_k^R$ can be determined using the following equations:

$$L_k^R = \frac{P_{k-1}^R \cdot D(C_k, L_k^{SC}, I_k)}{1 + P_{k-1}^R \cdot D(C_K, L_k^{SC}, I_k)^2} \quad (16)$$

and $$P_{k-1}^R = (1 - L_{k-1}^R \cdot D(C_{k-1}, L_{k-1}^{SC}, I_{k-1})) \cdot P_{k-2}^R \quad (17)$$

in which $D(C_k, L_k^{SC}, I_k)$ is a coefficient varying according to the corrected capacity $C_k$ of the battery, to the corrective gain $L_k^{SC}$ and to the current intensity measurement $I_k$. The coefficient $D(C_k, L_k^{SC}, I_k)$ can be defined by a function or a table. For example, the coefficient $D(C_k, L_k^{SC}, I_k)$ can be chosen equal to the value of the corrected capacity $C_k$.

Here again, the calculations to be performed in accordance with the equations (16) and (17) may also not be performed if the difference $dD_k$ is insufficient, e.g., if this difference triggers an insignificant correction of the corrected internal impedance $R_k$. Therefore, the impedance $R_k$ may remain unchanged for several iterations while the difference $dD_k$ remains below a certain threshold below which the corrective term $L_k^R \cdot dD_k$ is treated as not significant.

Figure 5:
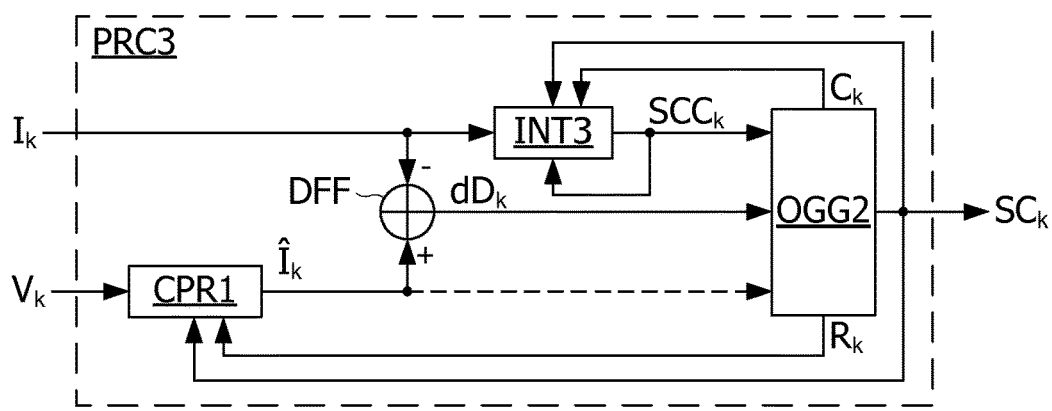

FIG. 5 represents processing functions implemented in a processor PRC3 corresponding to the processor PRC, according to another embodiment. The processor PRC3 differs from the processor PRC2 in that it is configured to receive at the same pace the current intensity $I_k$ and voltage $V_k$ measurement samples (t1=t2) and to integrate at the same pace t3=t1, the state of charge $SCC_k$. In these conditions, it can be shown that:

$$dD_k = (\hat{I}_k - I_k)/C_{k-1} \quad (18)$$

The processor PRC3 thus further differs from the processor PRC2 in that, at each instant k, the function DFF provides a function OGG2 with a difference $dD_k$ between the actual estimated current intensity value $\hat{I}_k$ and the actual current intensity measurement $I_k$ sample, at the instant k. The processor PRC3 further differs from the processor PRC2 in that the integration function INT4 is removed, and the estimated current intensity values $\hat{I}_k$ may be directly provided to the function OGG2. The processor PRC3 further differs from the processor PRC2 in that, at each instant k, the function OGG2 determines the values $SC_k$, $C_k$ and $R_k$ of the battery BATT based on the values $SCC_k$, $dD_k$ received from the functions INT3 and DFF, and possibly the values $\hat{I}_k$ received from the function CPR1.

It shall be noted that the processor PRC3 can function without reassessing the capacity $C_k$ and/or the internal resistance $R_k$ of the battery BATT, such that either one or both of the functions CPR1 and INT3 in FIG. 5 can be replaced with the functions CPR and INT1.

It will be understood by those skilled in the art that embodiments of the present disclosure are susceptible of various alternative embodiments and various applications. In particular, an embodiment can implement a processor programmed to perform all the functions described above CPR, INT1, INT2, DFF, DRV and OGG in FIG. 3, or CPR1, INT3, INT4, DFF, DRV and OGG1 in FIG. 4, or CPR1, INT3, DFF and OGG2 in FIG. 5. An embodiment can also implement dedicated circuits to perform some or all of the above-mentioned functions such as the functions CPR, CPR1, INT1, INT2, INT3, INT4, DFF and DRV.

In a battery comprising several parallel branches of several cells connected in series, it is thus possible to determine one state of charge per cell of the battery. For this purpose, the processor may comprise, for each parallel branch of cells, a processing circuit performing the function of acquiring current intensity measurements and the function INT1 or INT3, for each cell, a processing circuit performing the function of acquiring voltage measurements and the functions CPR and INT2, CPR1 and INT4 or CPR1 only, and, for each cell, a circuit for calculating a state of charge, performing the functions DFF, possibly DRV and OGG, OGG1 or OGG2. The processor can thus determine a state of charge $SC_k$ for each cell of the battery, and a global state of charge of the battery which can for example be chosen equal to the lowest state of charge of a cell obtained. In this configuration, the use of an analog-digital converter can be shared by several cells or branches of cells in series to acquire current and/or voltage measurements.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
iteratively estimating a state of charge of a battery; and
generating a signal indicative of a state of charge of the battery based on the estimated state of charge of the battery, wherein the iteratively estimating compensates for drifts in operating parameters of the battery over time and at least one iteration of the estimating includes:
receiving a measured indication of an intensity of current supplied by the battery;
receiving a measured indication of a voltage supplied by the battery;
estimating, using processing circuitry, a first state of charge of the battery during the iteration based on an estimated first state of charge of a previous iteration and on the received indication of the intensity of current supplied by the battery;
estimating, using the processing circuitry, an intensity of current supplied by the battery based on the received indication of the voltage supplied by the battery and on a corrected state of charge of the battery of the previous iteration; and
calculating, using the processing circuitry, a corrected state of charge of the iteration by adding to the estimated first state of charge of the iteration a corrective term, the corrective term being based on a product of a first correction gain and a factor representative of a difference between the estimated intensity of current and the received indication of the intensity of current supplied by the battery, wherein the estimated intensity of current is based on the following equation:

$$\hat{I}_k = \frac{V_k - OCV(SC_{k-1})}{R}$$

in which:
$\hat{I}_k$ is the estimated intensity of current,
$V_k$ is the indication of a voltage of the present iteration,
OCV( ) is a model of voltage supplied by the battery according to the state of charge of the battery,
$SC_{k-1}$ is the corrected state of charge of the previous iteration, and
R represents an internal resistance of the battery.

2. The method according to claim 1 wherein the iteration comprises estimating a second state of charge of the battery during the iteration based on a second estimated state of charge of the previous iteration and on the estimated intensity of current and the factor is determined based on a difference between the first and second estimated states of charge.

3. The method according to claim 2 wherein the first and second estimated states of charge are values integrated over a first period, and the factor is determined by deriving over the first period the difference between the first and second estimated states of charge.

4. The method according to claim 3 wherein the indication of the voltage is based on a measurement acquired in a second period, and the indication of the current intensity is based on a measurement acquired in a third period, the first period being greater than or equal to the second period and the second period being greater than or equal to the third period.

5. The method according to claim 4 wherein the first period is a multiple of the second period and of the third period.

6. The method according to claim 1 wherein the iteration comprises determining a corrected capacity value of the battery by adding to a corrected capacity value of the previous iteration a second corrective term, the second corrective term being based on a product of a second correction gain and a difference between the corrected state of charge of the iteration and the estimated first state of charge of the previous iteration, the estimated first state of charge being based on a corrected capacity value of the previous iteration.

7. The method according to claim 1 wherein the iteration comprises determining a corrected internal impedance value of the battery by adding to an internal impedance value of the previous iteration a corrective impedance term, the corrective impedance term being based on a product of an impedance correction gain and the factor, the estimated current intensity being based on a corrected internal impedance value of the previous iteration.

8. The method of claim 1, comprising:
determining, for a given iteration, whether to calculate a corrected state of charge based on whether the factor has a value greater than a threshold value.

9. The method according to claim 1, comprising determining the correction gain using at least one of the algorithms belonging to the group comprising LMS, RLS, NLMS, and extended Kalman filter.

10. A device, comprising:
a memory; and
processing circuitry, which, in operation:
iteratively estimates a state of charge of a battery; and
generates a signal indicative of a state of charge of the battery based on the estimated state of charge of the battery, wherein the iteratively estimating compensates for drifts in operating parameters of the battery over time and at least one iteration of the estimating includes:
receiving a measured indication of an intensity of current;
receiving a measured indication of a voltage;
estimating a first state of charge during the iteration based on an estimated first state of charge of a previous iteration and on the received indication of the intensity of current;
estimating an intensity of current based on the received indication of the voltage and on a corrected state of charge of the previous iteration; and
calculating a corrected state of charge of the iteration by adding to the estimated first state of charge of the iteration a corrective term, the corrective term being based on a product of a first correction gain and a factor representative of a difference between the estimated intensity of current and the received indication of the intensity of current, wherein the estimated intensity of current is based on the following equation:

$$\hat{I}_k = \frac{V_k - OCV(SC_{k-1})}{R}$$

in which:
$\hat{I}_k$ is the estimated intensity of current,
$V_k$ is the indication of a voltage of the present iteration,
OCV( ) is a model of voltage supplied by the battery according to the state of charge of the battery,
$SC_{k-1}$ is the corrected state of charge of the previous iteration, and
R represents an internal resistance of the battery.

11. The device of claim 10 wherein the at least one iteration comprises estimating a second state of charge during the iteration based on a second estimated state of charge of the previous iteration and on the estimated intensity of current and the factor is determined based on a difference between the first and second estimated states of charge.

12. The device of claim 11 wherein the processing circuitry comprises one or more integrators, the first and second estimated states of charge are values integrated by the one or more integrators over a first period, and the factor is determined by deriving over the first period the difference between the first and second estimated states of charge.

13. The device of claim 12 wherein the indication of the voltage is based on a measurement acquired in a second period, and the indication of the current intensity is based on a measurement acquired in a third period, the first period being greater than or equal to the second period and the second period being greater than or equal to the third period.

14. The device of claim 13 wherein the first period is a multiple of the second period and of the third period.

15. The device of claim 10 wherein the processing circuitry comprises an adder and the iteration includes determining a corrected capacity value by adding to a corrected capacity value of the previous iteration a second corrective term, the second corrective term being based on a product of a second correction gain and a difference between the corrected state of charge of the iteration and the estimated first state of charge of the previous iteration, the estimated first state of charge being based on a corrected capacity value of the previous iteration.

16. The device of claim 10 wherein the processing circuitry comprises an adder and the iteration includes determining a corrected internal impedance value by adding to an internal impedance value of the previous iteration a corrective impedance term, the corrective impedance term being based on a product of an impedance correction gain and the factor, the estimated current intensity being based on a corrected internal impedance value of the previous iteration.

17. The device of claim 10 wherein, in operation, the processing circuitry determines whether to calculate a corrected state of charge for a given iteration based on whether the factor has a value greater than a threshold value.

18. The device of claim 10, comprising:
a voltage measuring circuit;
a current intensity measuring circuit; and
an analog-digital converter coupled to the processing circuitry and which, in operation, provides samples of current intensity measurements and of voltage measurements based on measurements provided by the current and voltage measuring circuits to the processing circuitry.

19. The device of claim 18, comprising a multiplexer coupled to the voltage measuring circuit, the current intensity measuring circuit and the analog-digital converter.

20. The device according to claim 10, comprising:
one voltage measuring circuit per cell of the battery;
one current measuring circuit per parallel branch of series-connected cells of the battery;
one current intensity estimating circuit per cell of the battery;
one circuit to estimate a first state of charge per parallel branch of the battery; and
one circuit to calculate a corrected state of charge per cell of the battery.

21. The device of claim 10 wherein the processing circuitry, in operation, control an operation of the device based on the signal indicative of a state of charge of the battery.

22. The device of claim 10 wherein the device is one of a laptop, a digital tablet and a mobile telephone.

23. A device, comprising:
a memory; and
processing circuitry, which, in operation:
iteratively estimates a state of charge of a battery; and
generates a signal indicative of a state of charge of the battery based on the estimated state of charge of the battery, wherein the iteratively estimating compensates for drifts in operating parameters of the battery over time and at least one iteration of the estimating includes:
receiving a measured indication of an intensity of current;
receiving a measured indication of a voltage;
estimating a first state of charge during the iteration based on an estimated first state of charge of a previous iteration and on the received indication of the intensity of current;
estimating an intensity of current based on the received indication of the voltage and on a corrected state of charge of the previous iteration; and
calculating a corrected state of charge of the iteration by adding to the estimated first state of charge of the iteration a corrective term, the corrective term being based on a product of a first correction gain and a factor representative of a difference between the estimated intensity of current and the received indication of the intensity of current, wherein:
the processing circuitry comprises:
at least one integrator;
current intensity prediction circuitry;
drift calculation circuitry;
state of charge calculation circuitry; and
at least one adder; and
the estimated intensity of current is based on the following equation:

$$\hat{I}_k = \frac{V_k - OCV(SC_{k-1})}{R}$$

in which:
$\hat{I}_k$ is the estimated intensity of current,
$V_k$ is the indication of a voltage of the present iteration,
OCV( ) is a model of voltage supplied by the battery according to the state of charge of the battery,
$SC_{k-1}$ is the corrected state of charge of the previous iteration, and
R represents an internal resistance of the battery.

24. A non-transitory computer-readable memory medium whose contents cause one or more processing devices to, in operation:
automatically iteratively estimate a state of charge of a battery; and
generate a signal indicative of a state of charge of the battery based on the estimated state of charge of the battery, wherein the iteratively estimating compensates for drifts in operating parameters of the battery over time and at least one iteration of the estimating includes:
receiving a measured indication of an intensity of current;
receiving a measured indication of a voltage;
estimating a first state of charge during the iteration based on an estimated first state of charge of a previous iteration and on the received indication of the intensity of current;
estimating an intensity of current based on the received indication of the voltage and on a corrected state of charge of the previous iteration; and
calculating a corrected state of charge of the iteration by adding to the estimated first state of charge of the iteration a corrective term, the corrective term being based on a product of a first correction gain and a factor representative of a difference between the estimated intensity of current and the received indication of the intensity of current, wherein the estimated intensity of current is based on the following equation:

$$\hat{I}_k = \frac{V_k - OCV(SC_{k-1})}{R}$$

in which:
$\hat{I}_k$ is the estimated intensity of current,
$V_k$ is the indication of a voltage of the present iteration,
OCV( ) is a model of voltage supplied by the battery according to the state of charge of the battery,
$SC_{k-1}$ is the corrected state of charge of the previous iteration, and
R represents an internal resistance of the battery.

25. The medium of claim 24 wherein the iteration comprises estimating a second state of charge of the battery during the iteration based on a second estimated state of charge of the previous iteration and on the estimated intensity of current and the factor is determined based on a difference between the first and second estimated states of charge.

26. The medium of claim 25 wherein the first and second estimated states of charge are values integrated over a first period, and the factor is determined by deriving over the first period the difference between the first and second estimated states of charge.

27. The medium of claim 24 wherein the contents cause the processing circuitry, in operation, to determine whether to calculate a corrected state of charge for a given iteration based on whether the factor has a value greater than a threshold value.

28. The medium of claim 24, wherein the processing circuitry comprises:
one voltage measuring circuit per cell of the battery;
one current measuring circuit per parallel branch of series-connected cells of the battery;
one current intensity estimating circuit per cell of the battery;
one circuit to estimate a first state of charge per parallel branch of the battery; and
one circuit to calculate a corrected state of charge per cell of the battery.

29. The device according to claim 23, comprising:
one voltage measuring circuit per cell of the battery;
one current measuring circuit per parallel branch of series-connected cells of the battery;
one current intensity estimating circuit per cell of the battery;
one circuit to estimate a first state of charge per parallel branch of the battery; and
one circuit to calculate a corrected state of charge per cell of the battery.

30. The method according to claim 1 wherein the processing circuitry comprises:
one voltage measuring circuit per cell of the battery;
one current measuring circuit per parallel branch of series-connected cells of the battery;
one current intensity estimating circuit per cell of the battery;
one circuit to estimate a first state of charge per parallel branch of the battery; and
one circuit to calculate a corrected state of charge per cell of the battery.

31. The non-transitory computer-readable medium of claim 24 wherein the contents cause one or more processing devices to, in operation, control the one or more processing devices based on the signal indicative of a state of charge of the battery.

32. The non-transitory computer-readable medium of claim 24 wherein the one or more processing devices are processing devices of one of a laptop, a digital tablet and a mobile telephone.

* * * * *

UNITED STATES PATENT AND TRADEMARK OFFICE
CERTIFICATE OF CORRECTION

PATENT NO. : 10,073,144 B2
APPLICATION NO. : 14/494373
DATED : September 11, 2018
INVENTOR(S) : Christophe Lorin et al.

Page 1 of 1

It is certified that error appears in the above-identified patent and that said Letters Patent is hereby corrected as shown below:

In the Claims

Column 18, Line 2:
"$\hat{I}_l$ is the estimated intensity of current," should read, --$\hat{I}_k$ is the estimated intensity of current,--.

Signed and Sealed this
Seventh Day of May, 2019

Andrei Iancu
*Director of the United States Patent and Trademark Office*